United States Patent
Dufour et al.

(10) Patent No.: US 6,512,422 B2
(45) Date of Patent: Jan. 28, 2003

(54) OSCILLATOR WITH IMPROVED MAGNETIC COUPLING REJECTION

(75) Inventors: Yves Dufour, Sunnyvale, CA (US); Steffen W Hahn, Los Altos, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/823,369

(22) Filed: Mar. 30, 2001

(65) Prior Publication Data

US 2002/0140516 A1 Oct. 3, 2002

(51) Int. Cl.[7] .................................................. H03B 5/08
(52) U.S. Cl. ........................................ 331/167; 331/115
(58) Field of Search ................................ 331/167, 115; 336/181

(56) References Cited

U.S. PATENT DOCUMENTS

| | | | |
|---|---|---|---|
| 4,500,854 A | * 2/1985 | Meyer | 331/107 SL |
| 5,821,820 A | * 10/1998 | Snider et al. | 331/48 |
| 5,920,235 A | * 7/1999 | Beards et al. | 331/108 D |
| 5,983,084 A | * 11/1999 | Lin | 455/114 |

FOREIGN PATENT DOCUMENTS

EP 0940826 8/1999

OTHER PUBLICATIONS

Behzad Razavi "RF Microelectronics" 1998, Prentice Hall PTR.

* cited by examiner

*Primary Examiner*—Robert Pascal
*Assistant Examiner*—Joseph Chang
(74) *Attorney, Agent, or Firm*—Michael Schmitt

(57) ABSTRACT

The present invention provides an oscillator such as a voltage controlled oscillator (VCO) that can supply more stable frequency signals in the presence of strong magnetic coupling caused by external magnetic perturbations. According to one embodiment of the invention, an oscillator is presented and comprises an amplifier and an LC circuit connected to the amplifier. In the LC circuit, a first pair of inductors includes first and second inductors and a second pair of inductors includes third and fourth inductors. The first and second pairs are arranged such that the first and fourth inductors are on a first side and the second and third inductors are on a second side. In one arrangement, the inductors are positioned such that a center between the first and second inductors substantially overlap a center between the third and fourth inductors. Thus, it is possible to make the two pairs of inductors look symmetrical to the external perturbation generator without regard to the relative position of the perturbation generator. As a result, distortions in the output frequency signals of the oscillator are minimized.

17 Claims, 3 Drawing Sheets

OSCILLATOR WITH IMPROVED MAGNETIC COUPLING REJECTION

BACKGROUND OF THE INVENTION

The invention generally relates to electronic devices, and more particularly to oscillators such as voltage controlled oscillators (VCO's).

Oscillators such as VCO's have been used in many applications. One application is to use a VCO in a wireless device, e.g., a cell phone, to provide frequency signals to the transmitter of the cell phone. A conventional VCO is described on pages 227–229 of "RF Microelectronics" published in 1998, by Behzad Razavi, which is hereby incorporated by reference. A simplified version of the conventional VCO is illustrated in FIG. 1, in which feedback and output capacitors are omitted.

In FIG. 1, a VCO 10 comprises a LC tank 14 and an amplifier 18 with a gain of $-gm$. LC tank 14 includes a pair of inductors L1 and L2 and a tuning capacitor C. A perturbation generator 20 generates magnetic coupling to VCO 10. The perturbation generator can be any conductor that has a large current at the same or a fraction of the frequency of the VCO. This is especially true in applications where the received signals and the local oscillator run at the same frequency (Zero-IF), such as in a wireless device application, e.g., a pager or a cell phone application and the signals are strong (e.g., large current in the transmitter output bondwire). The magnetic coupling causes induced currents, to flow in inductors L1 and L2. The induced currents changes the frequency signals generated by VCO 10. As a result, the output spectrum of the transmitter of a wireless device will be distorted. Consequently, steady communications between the wireless device and other communications devices cannot be reliably established.

One attempted solution to reduce the magnetic coupling is to place the inductors L1 and L2 at such positions that their windings are in opposite directions relative to each other. This allows less coupling from perturbation generator 20 since the induced currents in the inductors are opposite in phase and will offset each other to some extent.

However, the above solution is not practical because the coupling depends on the relative position of the perturbation generator and the inductors. It is feasible only when the inductors can be placed symmetrical with respect to the perturbation generator 20, in which case the inducted currents in inductors L1 and L2 can cancel each other. Otherwise, the magnetic coupling will be different on the two sides and the induced currents are thus different on the two sides. Symmetrical placement is not always possible or practical and does not provide flexibility due to the large sizes of the inductors or multiple perturbation sources.

Therefore, there is a need for an oscillator, e.g., VCO that can provide more stable frequency signals in the presence of strong magnetic coupling.

SUMMARY OF THE INVENTION

The present invention provides an oscillator that can supply more stable frequency-signals in the presence of strong magnetic coupling.

According to one embodiment of the invention, an oscillator is presented and comprises an amplifier and an LC circuit connected to the amplifier. The LC circuit includes a capacitor having two ends, and first and second pairs of inductors, with the two pairs connected to the two ends of the capacitor, respectively.

According to one aspect of the embodiment of the invention, the first pair includes first and second inductors and the second pair includes third and fourth inductors. Further, the first and second pairs are arranged such that the first and fourth inductors are on a first side and the second and third inductors are on a second side.

According to another aspect of the embodiment of the invention, the inductors are arranged such that a center between the first and second inductors substantially overlap a center between the third and fourth inductors. Assuming the magnetic coupling to each pair of inductors is at the center of the two inductors because of center of gravity, it is possible to make the two pairs of inductors look symmetrical to an external perturbation generator without regard to the relative position of the perturbation generator.

According to a further aspect of the embodiment of the invention, the first and second inductors are arranged such that the first and second inductors have their magnetic fields in opposite directions. Moreover, the third and fourth inductors are arranged such that the third and fourth inductors have their magnetic fields in opposite directions. In such arrangement, induced currents in the inductors cancel each other, thus minimizing the output frequency signals of the oscillator.

Other objects and attainments together with a fuller understanding of the invention will become apparent and appreciated by referring to the following description and claims taken in conjunction with the accompanying drawings.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions.

DETAILED DESCRIPTION OF THE PREFERRED EMBODIMENTS

Figure 1:
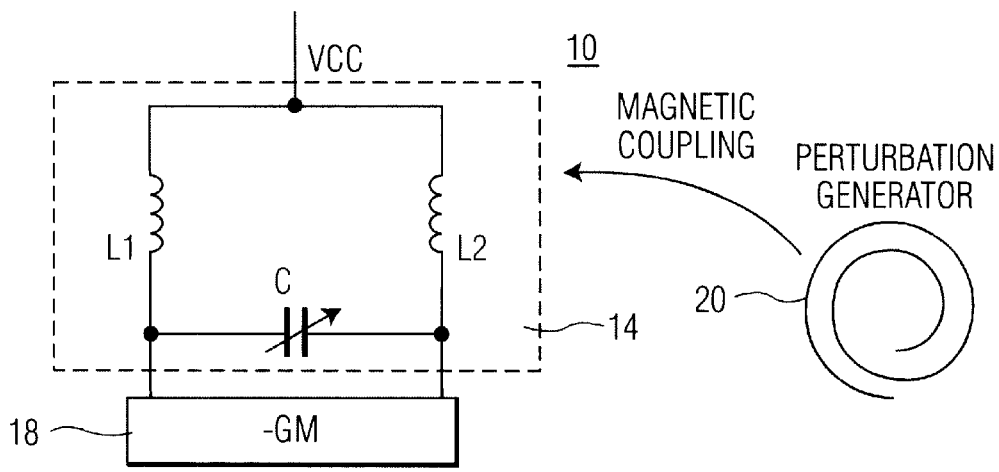
FIG. 1 shows a conventional VCO.
Figure 2:
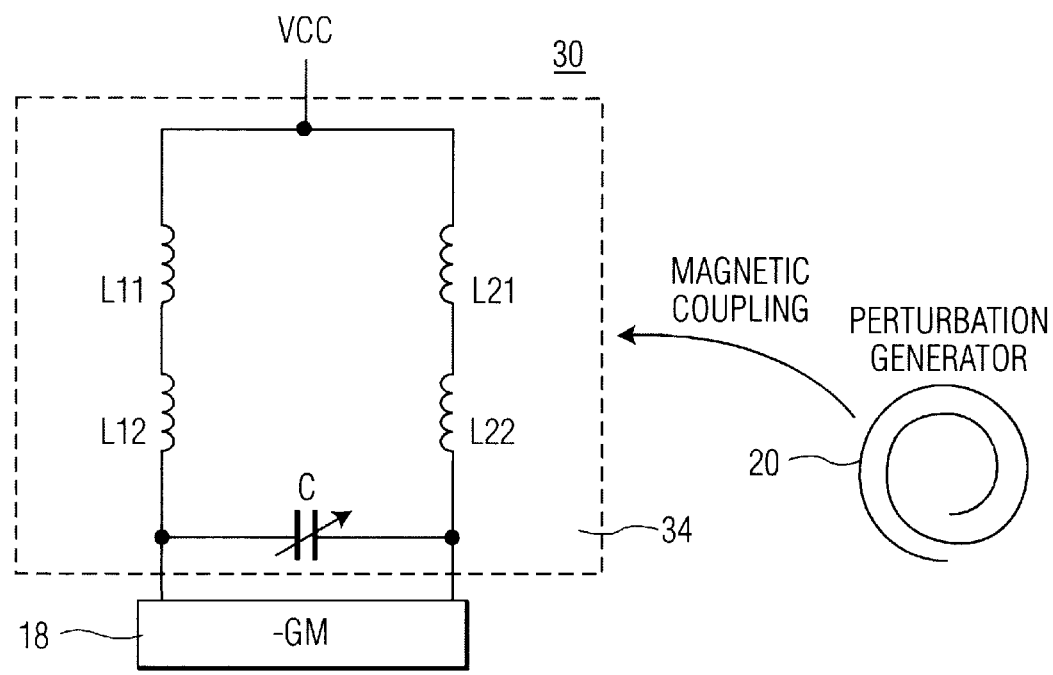
FIG. 2 shows a circuit diagram of a VCO according to one embodiment of the present invention.

FIG. 2 shows a circuit diagram of a VCO 30 according to one embodiment of the present invention. VCO 30 includes a LC tank 34 and an amplifier 18 with a gain of $-gm$. LC tank 34 includes two pairs of inductors L11, L12 and L21, L22 on the two sides, respectively and a tuning capacitor C. As in FIG. 1, the feedback and output capacitors are omitted in FIG. 2 for simplicity. In this embodiment, two equivalent inductors are used on each side of LC tank 34 in place of each of the original inductors L1 and L2 in FIG. 1. The sum of the two equivalent inductors on each side is equal to the original inductor on that side, i.e., L1=L11+L12 and L2=L21+L22. Although the two equivalent inductors on each side need not be equal to each other, if they are made equal, optimal cancellation of magnetic coupling can be achieved.

Figure 3:
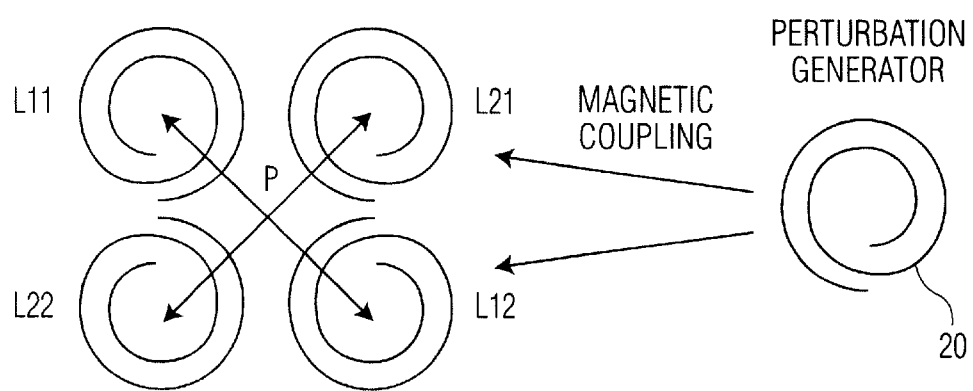
FIG. 3 shows a common centroid arrangement of the inductors in the VCO in FIG. 2.

FIG. 3 shows a common centroid arrangement of the two inductor pairs L11, L12 and L21, L22 in VCO 30. In this arrangement, the centers of the two inductor pairs are located at the same point P. Let's assume the magnetic coupling to the two inductors on each side at point P (i.e., at the center of the pair) is equivalent to the magnetic coupling to the original inductor on that side because of the center of gravity. Thus, it is possible to make the two pairs of inductors L11, L12 and L21, L22 look symmetrical to perturbation generator 20 without regard to the relative position of the perturbation generator and have them receive the same magnetic coupling regardless of the direction of the perturbation generator. The magnetic coupling can be approximated to a linear influence if the two inductor pairs are closely positioned compared to the distance to the perturbation generator.

Figure 4:
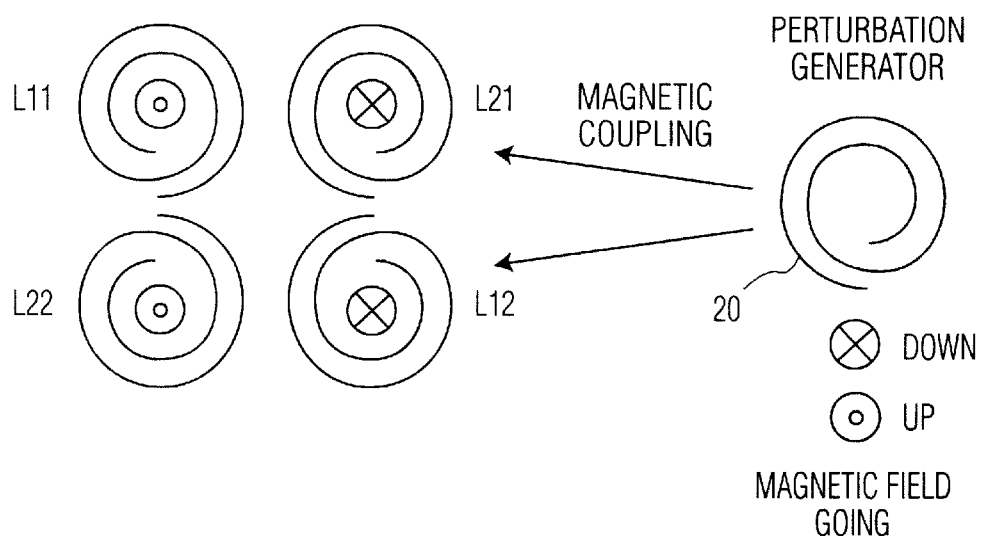
FIG. 4 shows an arrangement of the windings of the inductors in FIG. 3.

FIG. 4 shows an exemplary arrangement of the windings of the two inductor pairs and illustrates the directions of the magnetic fields within each inductor. In FIG. 4, the two inductors on each side of the LC tank are wound in opposite directions, such that the induced currents in the two inductors caused by the magnetic coupling from perturbation generator 20 are opposite in phase. In FIG. 4, if the centers of the two inductor pairs are not aligned at the same point, the resulting magnetic coupling on each side of the LC tank is still received at an equivalent center of the two inductors but is attenuated. The net magnetic coupling on each side is the difference between the magnetic coupling received by the two inductors. The reduction of the magnetic coupling can be expected to be one order of magnitude better compared to the conventional VCO in FIG. 1. If the common centroid arrangement in FIG. 3 is used, the magnetic coupling can be further reduced.

Figure 5:
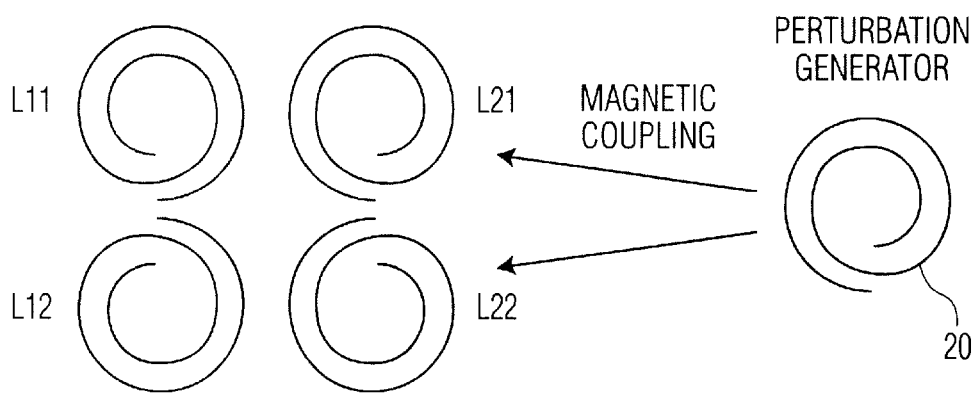
FIG. 5 shows another arrangement of the inductors in the VCO in FIG. 2.
Figure 6:
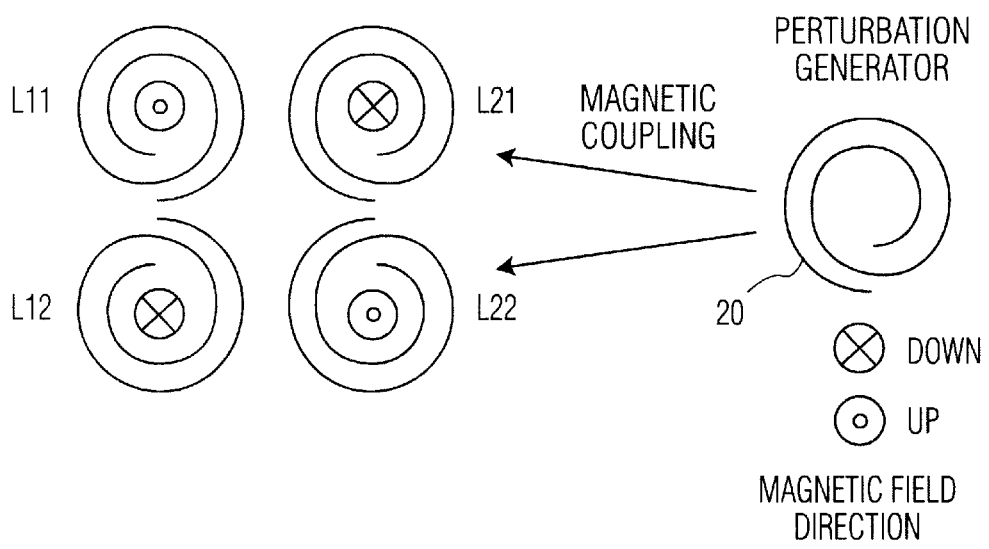
FIG. 6 shows an arrangement of the windings of the inductors in FIG. 5.

FIG. 5 shows another arrangement of two inductor pairs L11, L12 and L21 and L22 in VCO 30. FIG. 6 shows an exemplary arrangement of the windings of the two inductor pairs in FIG. 5 and illustrates the directions of the magnetic fields within each inductor. In the arrangement of FIG. 6, since the induced currents on the two inductors of each side of the LC tank are opposite in phase, they cancel each other, thus minimizing any frequency changes caused by the magnetic coupling from perturbation generator 20. In this embodiment, the best results are obtained when perturbation generator 20 is symmetrical with respect to the two sides of the LC tank.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims.

What is claimed is:

1. An oscillator, comprising:
    an amplifier; and
    an LC circuit connected to the amplifier, the LC circuit including:
        a capacitor having two terminals; and
        a first pair of inductors electrically coupled to each other in series and a second pair of inductors electrically coupled to each other in series, with each of the two pairs connected to one of the two terminals of the capacitor;
        wherein the first pair of inductors includes a first inductor and a second inductor, and the second pair of inductors includes a third inductor and a fourth inductor; and
        wherein the first and second pairs are arranged such that the first and fourth inductors are co-located on a first side of a point and the second and third inductors are co-located on a second, opposing side of the point.

2. The oscillator of claim 1, wherein the inductors are arranged such that a center between the first and second inductors substantially overlaps a center between the third and fourth inductors.

3. The oscillator of claim 1, wherein the first and second inductors are arranged such that the first and second inductors have their magnetic fields in opposite directions; and
    wherein the third and fourth inductors are arranged such that the third and fourth inductors have their magnetic fields in opposite directions.

4. The oscillator of claim 1 wherein the inductors of the first pair are substantially equal to each other in value and the inductors of the second pair are substantially equal to each other in value.

5. The oscillator of claim 1, wherein the first pair includes first and second inductors and the second pair includes third and fourth inductors;
    wherein the inductors of the first and second pairs are arranged such that the first and second inductors are on a first side and the third and fourth inductors are on a second side.

6. The oscillator of claim 5, wherein the first and second inductors are arranged such that first and second inductors have their magnetic fields in the same direction;
    wherein the third and fourth inductors are arranged such that the third and fourth inductors have their magnetic fields in the same direction.

7. A communication device, comprising:
    a transmitter configured to transmit signals; and
    an oscillator connected to the transmitter, the oscillator includes
    an amplifier; and
    an LC circuit connected to the amplifier, the LC circuit including:
        a capacitor having two terminals; and
        a first pair of inductors electrically coupled to each other in series and a second pair of inductors electrically coupled to each other in series, with each of the two pairs connected to one of the two terminals of the capacitor;
        wherein the first pair of inductors includes a first inductor and a second inductor, and the second pair of inductors includes a third inductor and a fourth inductor; and
        wherein the first and second pairs are arranged such that the first and fourth inductors are co-located on a first side of a point and the second and third inductors are co-located on a second, opposing side of the point.

8. The device of claim 7, wherein the inductors are arranged such that a center between the first and second inductors substantially overlap a center between the third and fourth inductors.

9. The device of claim 8, wherein the first and second inductors are arranged such that the first and second inductors have their magnetic fields in opposite directions;
    wherein the third and fourth inductors are arranged such that the third and fourth inductors have their magnetic fields in opposite directions.

10. A method for making an oscillator, comprising:
    connecting first and second inductors together in series as a first pair of inductors;

connecting the first pair to a first end of a capacitor;

connecting the third and fourth inductors together in series as a second pair of inductors;

connecting the second pair to a second end of the capacitor;

connecting the capacitor to an amplifier in parallel;

aligning the first and fourth inductors on a first side of a point;

aligning the second and third inductors on a second side of the point; and aligning a center between the first and second inductors to a center between the third and fourth inductors, so that the two centers are substantially overlapped.

11. The method of claim 10, further comprising the steps of:

arranging the first and second inductors such that the first and second inductors have their magnetic fields in opposite directions; and arranging the third and fourth inductors such that the first and second inductors have their magnetic fields in opposite directions.

12. An oscillator, comprising:

an amplifier means; and an LC circuit means connected to the amplifier means, the LC circuit means including:

capacitor means having two terminals; and a first pair of inductor means electrically coupled to each other in series and a second pair of inductor means electrically coupled to each other in series, with each of the two pairs connected to one of the two terminals of the capacitor means;

wherein the first pair of inductor means includes a first inductor means and a second inductor means, and the second pair of inductor means includes a third inductor means and a fourth inductor means; and wherein the first and second pairs are arranged such that the first and fourth inductor means are co-located on a first side of a point and the second and third inductor means are co-located on a second, opposing side of the point.

13. The oscillator of claim 12, wherein the inductor means are arranged such that a center between the first and second inductor means substantially overlap a center between the third and fourth inductor means.

14. The oscillator of claim 12, wherein the first and second inductor means are arranged such that the first and second inductor means have their magnetic fields in opposite directions; and wherein the third and fourth inductor means are arranged such that the third and fourth inductor means have their magnetic fields in opposite directions.

15. The oscillator of claim 12 wherein the inductor means of the first pair are substantially equal to each other in value and the inductor means of the second pair are substantially equal to each other in value.

16. The oscillator of claim 12, wherein the first pair includes first and second inductor means and the second pair includes third and fourth inductor means;

wherein the inductor means of the first and second pairs are arranged such that the first and second inductor means are on a first side and the third and fourth inductor means are on a second side.

17. The oscillator of claim 16, wherein the first and second inductor means are arranged such that first and second inductor means have their magnetic fields in the same direction;

wherein the third and fourth inductor means are arranged such that the third and fourth inductor means have their magnetic fields in the same direction.

* * * * *